2,784,117

METHOD OF RUGGEDIZING MINIATURIZED ELECTRICAL AND ELECTRONIC EQUIPMENT

Erik G. Linden, Red Bank, N. J., assignor to the United States of America as represented by the Secretary of the Army No Drawing. Application April 29, 1954, Serial No. 426,611

1 Claim. (Cl. 117—218)

(Granted under Title 35, U. S. Code (1952), sec. 266)

The invention described herein may be manufactured and used by or for the Government for governmental purposes without the payment of any royalty thereon.

This invention relates to methods of ruggedizing miniaturized electrical and electronic equipment.

Miniaturized electrical and electronic components and equipment such as printed circuits, coils, capacitors, miniaturized radios, radar and navigation equipment, proximity fuses, etc. have to be ruggedized, that is, they have to be made waterproof and mechanically rugged. This may be done by imbedding the equipment in so-called incapsulating resins or by coating the surface with a thin coating of a resin which may be of any suitable synthetic high polymer such as phenol-formaldehyde resins, epoxy resins (epichlorhydrinbisphenol), furane resins, silicones, thiokols, various polyester resins, cellulose accetate, polystyrene, polyvinyl esters, elastomers, etc.

Synthetic high polymers are organic substances and coatings made from such organic materials do not block moisture completely since the distance between the atoms of an organic material is greater than the water molecule itself.

It has already been proposed to sandwich a very thin metal layer between two resin layers since metal completely blocks penetration by water molecules. However, certain frequencies would heat the thin metal layer and endanger not only the coating but the miniaturized equipment itself.

It is an object of this invention to provide miniaturized electrical and electronic equipment with a very thin dielectric resin coating of highly improved moisture-resistance by sandwiching an extremely thin but water-impervious silica or quartz film between two layers of insulating dielectric resin. This may be achieved by coating the object to be ruggedized with a thin coating of a suitable insulating, dielectric resin, covering this first resin coat by the methods of high vacuum evaporation (sputtering) with an extremely thin silica or quartz film (about 1 mil thickness) and then covering this silica or quartz film with a second layer of an insulating, dielectric resin.

The invention will become more apparent from the following description of specific embodiments of the broad inventive idea.

The process of ruggedization of miniaturized objects, according to the invention, may best be performed in three steps.

*Step 1.*—The surface of the object to be ruggedized is first degreased and otherwise cleaned and dried thoroughly preferably in an oven and then sprayed or dip-coated with a good electrical grade varnish or casting resin. This first coat may be as thin as 2 mils but thicker coatings may be used if desired; the film is then dried or cured, according to the nature of the resin used. Any of the resins mentioned above, or mixtures of such resins with or without appropriate fillers, plasticizers, driers, etc. may be used.

It is essential that no volatile constituents remain in the resin film due to incomplete curing, since under the high vacuum conditions to which this film will be exposed in the second step, the out-gassing volatile products would seriously affect the process of high vacuum evaporation. Preferably resins with the lowest out-gassing tendencies should be used.

*Step 2.*—The object with the finished film made according to Step 1, is placed in a vacuum sputtering or deposition chamber of any known vacuum coating unit where it is coated with an extremely thin layer, about 1 mil or less, of silica or quartz.

High vacuum deposition of thin films of metal, silica or other relatively high melting solids on plastic objects or objects having plastic surfaces, is well known in the industry, both for ornamentation and for functional applications. In many cases it has supplanted chemical methods, brushing, and the use of the spray gun.

The object with the surfaces to be coated with silica or quartz for the purpose of the present invention is arranged in conventional manner in a vacuum chamber to face the point from which the silica or quartz is to be evaporated. With the number of air molecules reduced many million fold the vapor molecules travel without deflecting collisions in straight lines from the source to attach themselves filmly to the surface to be coated. The thickness of the silica or quartz film may be as thin as 1 mil or even less.

Instead of silica or quartz it is sometimes advantageous to use silicon monoxide as the material to be evaporated. Silicon monoxide is a brown granular substance that evaporates at somewhat lower temperature than silica or quartz. The deposited film of silicon monoxide is immediately converted to silicon dioxide or silica by contact with air.

In some cases it may be preferable to coat the first resin film with a preliminary layer of silica obtained chemically from an aqueous solution of tetraethyl silicate or other silicon esters. Tetraethyl silicate is a colorless liquid of mild odor. It is slowly hydrolyzed by water to alcohol and silicic acid which in turn dehydrates to pure silica. A preliminary coat of silica may, for instance, be obtained by brushing an aqueous solution of tetraethyl silicate on the surface to be coated and then drying the brushed-on film. After this preliminary treatment the object is then placed into the high vacuum chamber and treated in the same manner as described above to obtain a second and completely impervious layer of silica or quartz. The first silica film acts as an "undercoat" for the second silica film.

*Step 3.*—After the object to be ruggedized has been coated by vacuum evaporation with a silica or quartz film it is again sprayed or dip-coated with a good electrical grade varnish or cast resin as described in Step 1. This second resin coat is preferably applied immediately after the object is taken out of the vacuum chamber. The second resin coat may or may not consist of the same resin as the first coat, and the thickness of this second coat may or may not be the same as that of the first coat. A thickness of about 2 mils was found to be sufficient for most purposes though greater thicknesses may of course be used.

The combination coating made according to the present invention possesses a highly improved moisture resistance because of the water impervious silica or quartz film sandwiched between the two layers of insulating resin. Since the distance between the silica or quartz molecules is smaller than the water molecule itself a very thin but continuous quartz film of about 1 mil thickness or even less is sufficient to prevent any water molecules to penetrate through the film. The two resin films mechanically protect the silica or quartz film from cracking or from any other injury due to handling.

It will be understood by those skilled in the art that many other variations and combinations than those described are conceivable within the scope of the inventive idea as defined in the appended claim.

What is claimed is:

In a method of ruggedizing miniaturized electrical and electronic equipment comprising the step of providing the surface of the object to be ruggedized with extremely thin silica films sandwiched between two films of dielectric resins the improvement comprising the steps of treating a first resin film with an aqueous solution of tetraethyl silicate to chemically produce a first silica film and depositing a second silica film on the first silica film by high vacuum evaporation.

References Cited in the file of this patent

UNITED STATES PATENTS

| | | |
|---|---|---|
| 60,478 | Coggeshall | Dec. 18, 1866 |
| 2,456,899 | Strong | Dec. 21, 1948 |
| 2,540,623 | Law | Dec. 21, 1948 |
| 2,568,004 | Heyman | Sept. 18, 1951 |
| 2,683,766 | Cunningham | July 13, 1954 |

OTHER REFERENCES

Burnetti et al. Printed Circuit Techniques, National Bureau of Standards Circular 468.